United States Patent [19]
Agnello et al.

[11] Patent Number: 5,608,266
[45] Date of Patent: Mar. 4, 1997

[54] THIN FILM FOR A MULTILAYER SEMICONDUCTOR DEVICE FOR IMPROVING THERMAL STABILITY AND A METHOD THEREOF

[75] Inventors: Paul D. Agnello, Wappingers Falls; Cyril Cabral, Jr., Ossining; Lawrence A. Clevenger, LaGrangeville; Matthew W. Copel, Yorktown Heights; Francois M. d'Heurle, Ossining, all of N.Y.; Qi-Zong Hong, Plano, Tex.

[73] Assignee: International Business Machines Corporation, Armonk, N.Y.

[21] Appl. No.: 458,977

[22] Filed: Jun. 2, 1995

Related U.S. Application Data

[62] Division of Ser. No. 226,923, Apr. 13, 1994.

[51] Int. Cl.$^6$ .......................... H01L 23/48; H01L 23/52; H01L 29/40
[52] U.S. Cl. .......................... 257/768; 257/769; 257/757
[58] Field of Search .......................... 257/768, 769, 257/757, 743

[56] References Cited

U.S. PATENT DOCUMENTS

| | | |
|---|---|---|
| 4,322,453 | 3/1982 | Miller . |
| 4,663,191 | 5/1987 | Choi et al. . |
| 4,707,197 | 11/1987 | Hensel et al. . |
| 4,907,052 | 6/1990 | Takada et al. . |
| 4,946,803 | 8/1990 | Ellwanger . |
| 5,041,391 | 8/1991 | Ono . |
| 5,075,251 | 12/1991 | Torres et al. . |
| 5,302,552 | 4/1994 | Duchateau et al. . |

FOREIGN PATENT DOCUMENTS 6-13340  1/1994  Japan .

OTHER PUBLICATIONS

Jiang et al, "Ultra Shallow Junction Formation Using Diffusion From Silicide", J. Electr. Soc. vol. 139, No. 1, Jan. 1992.

"Comparison of Transformation to Low–Resistivity Phase and Agglomeration of $TiSi_2$ and $Co/Si_2$" Lasky et al, IEE Trans of Electron Devices, vol. 38, No. 2, Feb. 1991 pp. 262–269.

"Quantum Transport in Ultra Thin $Co/Si_2$ Epitaxal Films"—DiTusa et al—1990 American Institute of Physics pp. 452–454—Appl. Phy. Lett.(5) 30 Jul. 1990.

A. Nishiyama, Y. Akasaka, Y. Ushiku, K. Hishioka, Y. Suizu and M. Shiozaki, *A Thermally Stable Salicide Process Using $N_2$ Implantation into $TiSi_2$*, "IEEE 1990", (Jun. 12–13, 1990 VMIC Conference), pp. 310–316.

R. V. Joshi, *High Conductivity Multiphase Metal–Silicide Alloy*, "IBM Technical Disclosure Bulletin", vol. 30, No. 7, (Dec. 1987).

(List continued on next page.)

*Primary Examiner*—Sara W. Crane
*Assistant Examiner*—S. V. Clark
*Attorney, Agent, or Firm*—Ratner & Prestia

[57] ABSTRACT

A method and a device directed to the same, for stabilizing cobalt silicide/single crystal silicon, amorphous silicon, polycrystalline silicon, germanide/crystalline germanium, polycrystalline germanium structures or other semiconductor material structures so that high temperature processing steps (above 750° C.) do not degrade the structural quality of the cobalt silicide/silicon structure. The steps of the method include forming a silicide or germanide by either reacting cobalt with the substrate material and/or the codeposition of the silicide or germanide on a substrate, adding a selective element, either platinum or nitrogen, into the cobalt and forming the silicide germanide by a standard annealing treatment. Alternatively, the cobalt silicide or cobalt germanide can be formed after the formation of the silicide or germanide respectively. As a result, the upper limit of the annealing temperature at which the silicide or germanide will structurally degrade is increased.

13 Claims, 5 Drawing Sheets

OTHER PUBLICATIONS

K. W. Choi and S. Roberts, *Improved Salicide Process With Multilayer Silicide Formation*, "IBM Technical Disclosure Bulletin", vol. 27, No. 7B, (Dec. 1984).

Bin–Shing Chen et al., "Formation of cobalt–silicided p+n junctions using implant through silicide technology", Journal of Applied Physics, Nov. 15, 1992, vol. 72, No. 10, pp. 4619–4626, USA.

K. T. Ho et al., "Application of Nitrogen in a Cobalt–Silicide–Forming System", Thin Solid Films, May 24, 1985, vol. 127, No. 3–4, pp. 313–322, Switzerland.

1991 European Workshop on Refractory Metals and Silicides, Saltsjobaden, Sweden, Mar. 24–27, 1991, S. Nygren et al., "Morphological Instabilities of Nickel and Cobalt Silicides on Silicon", Applied Surface Science, 1991, vol. 53, pp. 87–91, Netherlands.

5,608,266

THIN FILM FOR A MULTILAYER SEMICONDUCTOR DEVICE FOR IMPROVING THERMAL STABILITY AND A METHOD THEREOF

This application is a division of application Ser. No. 08/226,923 filed Apr. 13, 1994, allowed.

FIELD OF THE INVENTION

The present invention relates to semiconductor devices, and more particularly, to a method and an apparatus for improving the structural stability of cobalt silicides/germanides during high temperature annealing by the addition of one of platinum and nitrogen to cobalt silicide/germanide.

BACKGROUND OF THE INVENTION

It is well known by those skilled in the art that the electrical contact and structural stability of a cobalt silicide thin film in contact with a silicon substrate is critical for electrical conductivity and performance of semiconductor devices. It is also well known by those skilled in the art that the electrical contact and structural stability of a cobalt germanide thin film in contact with a germanium substrate is also critical. Therefore, a thin film of cobalt silicide or cobalt germanide which has enhanced resistance to structural degradation caused by thermal annealing is desirable.

Problems with cobalt silicide/silicon contact regions have been found when the cobalt silicide structure is exposed to high temperature annealing (over 750° C.). Those skilled in the art have discovered that a low resistance cobalt silicide/silicon contact treated by heating over 750° C. results in a contact in which the quality degrades because of the agglomeration and/or inversion Of the cobalt silicide and the silicon substrate, This causes open or high resistance interconnections, high contact resistances and electrical leakage which lead to device failure.

For example, as known to those skilled in the art, one aspect of current silicon technology utilizes ion implantation for the formation of source/drain junctions followed by the deposition of a thin cobalt film and thermal annealing at 600° C. to 750° C. to convert cobalt into cobalt silicide. After silicide formation, a high temperature thermal anneal is performed (>750° C.) to electronically activate the dopants in the source, gate and drain regions of the device. Low sheet resistance contacts and low leakage source and drain junctions are difficult to form by this technique because of the structural degradation of the cobalt silicide that occurs during the high temperature activation anneal.

One approach to solve these problems is to conduct the ion implantations and high temperature annealing steps (>750° C.) required for the source, gate and drain electrical activation before the deposition and formation of the cobalt silicide/silicon contact. However, further processing of the silicon device after silicide formation must be limited to temperatures below the formation temperature of the cobalt silicide in order to avoid agglomeration of the cobalt silicide and device degradation. These temperature limitations are often difficult to maintain for processing of integrated silicon circuits.

Yet another shortcoming with the known technology occurs because the silicon used for the cobalt silicide/silicon contact is polycrystalline silicon. This would be the situation in local interconnects for wiring transistors together or gate structures for CMOS, bipolar or ASIC circuits. Thin film cobalt silicide/polycrystalline silicon contacts have less structural stability under thermal stressing than cobalt silicide/single Crystal silicon structures. As a result, the thin film cobalt silicide/polycrystalline will agglomerate and invert with lower temperature anneals. As known to those skilled in the art, this problem is particularly acute in integrated schemes where the cobalt silicide/polycrystalline silicon gate contact is formed during the cobalt silicide/silicon source and drain formation and before high temperature dopant electronic activation anneals.

Some prior art designs provide alternate structures using silicide and silicon substrates. However, these designs fail to achieve a structure which can satisfy the above criteria for high temperature resistance of silicide to thermal agglomeration on a silicon substrate.

SUMMARY OF TEE INVENTION

A method for forming a thin film on a substrate and a device directed to the same. The method includes forming a mixture of cobalt and platinum and/or nitrogen. Then reacting the mixture with the substrate to form the thin film which is thermally stable and resistant to agglomeration and layer inversion during elevated thermal cycles. The substrate is amorphous silicon, single crystal silicon, polycrystalline silicon, amorphous germanium, single crystalline germanium, polycrystalline germanium, or semiconductors or compound semiconductors of columns IIb, IIIa, IVa, Va, and VIa of the periodic table.

BRIEF DESCRIPTION OF THE DRAWING

The aspects, features and advantages of the present invention will be more readily understood from the following detailed description when read in conjunction with the accompanying drawings, in which.

DETAILED DESCRIPTION OF THE INVENTION

An exemplary method of the present invention will now be described more fully with reference to FIGS. 1(a)–(e)–3, in which a semiconductor device is shown during successive stages of manufacture.

Figure 1A:
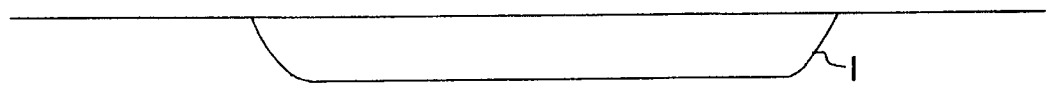
FIGS. 1(a)–1(e) show the steps in making a multilayered CMOS device having a source, drain and gate region of a CMOS multilayered device in accordance with the exemplary method of the present invention.
Figure 1B:
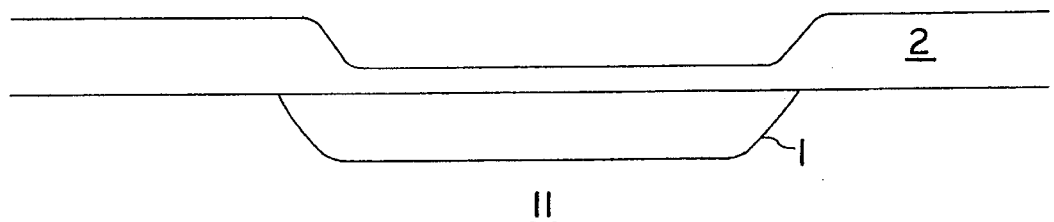

As shown in FIG. 1(a), the starting material is a semiconductor substrate 11, in this example of n-type single crystal silicon, including a p-well 1, which was formed by doping the substrate 11. A silicon substrate material is preferred. Subsequently, as shown in FIG. 1(b), an-oxide and/or nitride insulation layer 2 is formed on substrate 11 over p-well 1. The insulation layer 2, for example, is formed by thermal oxidation.

Figure 1C:
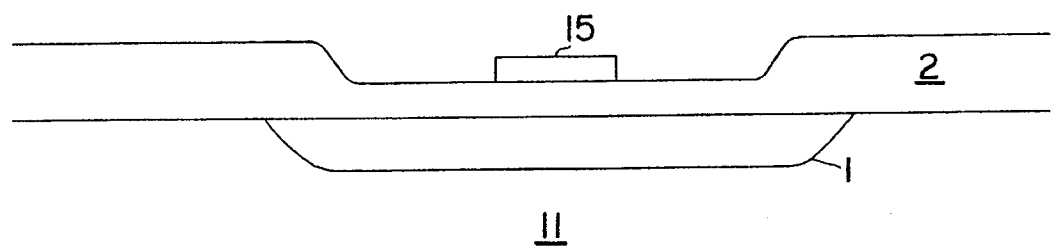
Figure 1D:
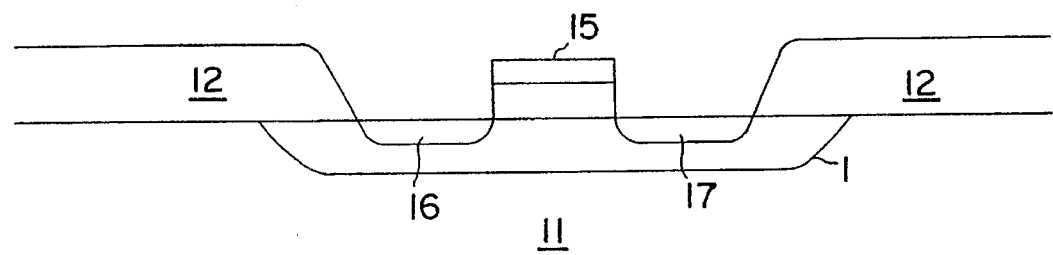

Then, on the insulation layer, a polysilicon layer 15 is formed as shown in FIG. 1(c), for example, by chemical vapor deposition. Subsequently, as shown in FIG. 1(d), by means of implantation, n+ type source region 16 and drain region 17 are formed in p-well 1 and oxide layer 2 is selective removed above the source and drain regions to expose source region 16 and drain region 17. Then, nitride and/or oxide thin film spacers 13 are formed on either side of the polycrystalline silicon layer 15 as shown in FIG. 1(e).

Figure 1E:
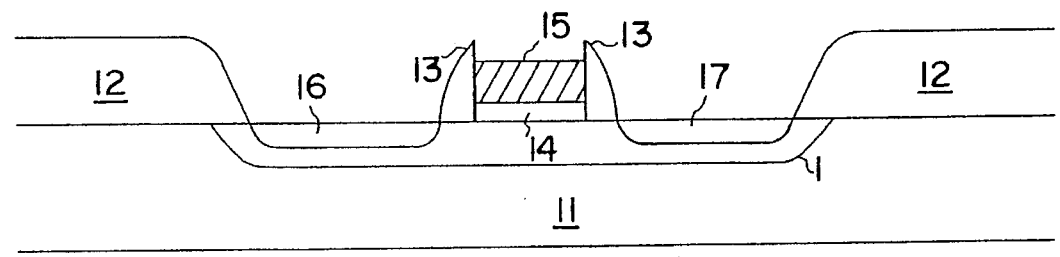

Thus, the CMOS device shown in FIG. 1(e) is constructed. The CMOS includes a single crystal silicon substrate 11 with oxide and/or nitride insulation layers 12 which separate the active area of the CMOS device from adjacent devices. The gate region of the CMOS device includes gate oxide 14, polycrystalline silicon layer 15 and nitride and/or oxide thin film spacers 13. Thin film spacers 13 separate gate region from source region 16 and drain region 17.

Figure 2:
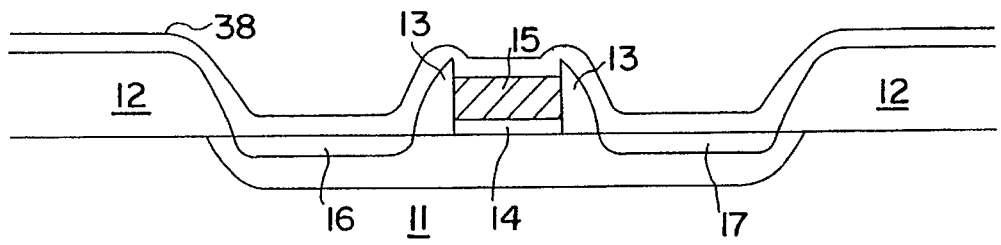
FIG. 2 is a cross-sectional schematic view of a CMOS device of the type shown in FIGS. 1(a)–1(e) after the deposition of a conducting cobalt thin film which contains platinum.

Then, as shown in FIG. 2, a cobalt-alloy thin film layer 38 is then deposited over insulation layer 12, source region 16, drain region 17 and gate region. The cobalt-alloy includes platinum in concentrations less than 10 atomic percent. As will become more clear in the discussion hereinafter, the addition of platinum improves the structural stability of the formed cobalt silicide contacts under high temperature annealing. The thickness of the cobalt-alloy thin film layer 38 to be applied is in a range of 0–200 nm depending upon the relative dimensions, function, and intended use of the devices to constructed. However, a thickness range from 5 to 30 nm is preferred for the CMOS device.

Figure 3:
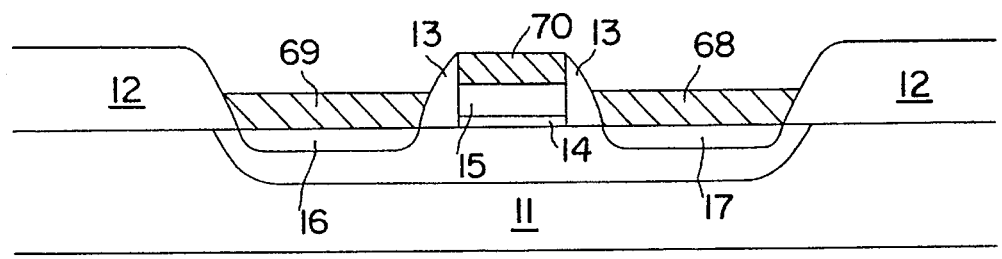
FIG. 3 is a cross-sectional schematic view of the exemplary embodiment of the present invention after the formation of the source, drain and gate contacts by thermal annealing and selective etching.

Then, the CMOS device annealed in a typical annealing process at temperatures less than 750° C. to form cobalt silicide source contact 69, cobalt silicide drain contact 68, and cobalt silicide gate contact 70 as shown in FIG. 3. The cobalt-alloy layer reacts with the substrate 11 and the polycrystalline-silicon gate 15, during the annealing process to form the cobalt-platinum silicide source 68, drain 69 and gate 70 contacts. Any remaining unreacted cobalt-alloy is etched away by methods known to those skilled in the art using, for example, either an acid or base solution in the presence of an oxidizing agent.

When the device shown in FIG. 3 is heated to temperatures in excess of 750° C., source 69, drain 68 and gate 70 silicide contacts do not structurally degrade. The structure of the silicide contacts are the same after the formation anneals below 750° C. and after any later anneals higher than 750° C. This is because platinum had been added to the cobalt silicide.

Figure 4:
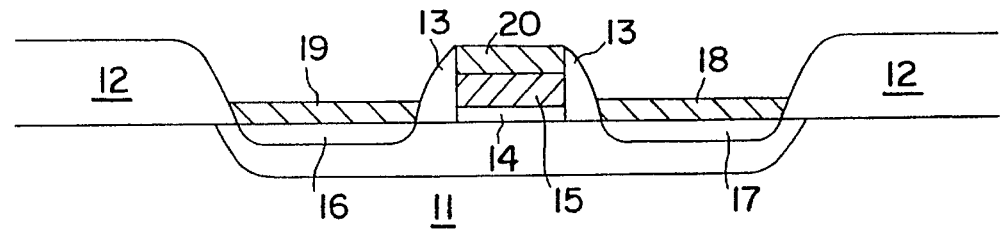
FIG. 4 is a cross-sectional schematic view of a a conventional CMOS device after the formation of the source, drain and gate contacts by thermal annealing and selective etching.

For comparison, FIG. 4 shows a conventional CMOS device in which platinum has not been added to the cobalt silicide contacts. The CMOS device shown in FIG. 4 has cobalt silicide source contact 19, cobalt silicide drain contact 18, and cobalt silicide gate contact 20 which were formed using a typical annealing process at temperatures less than 750° C. to form.

Figure 5:
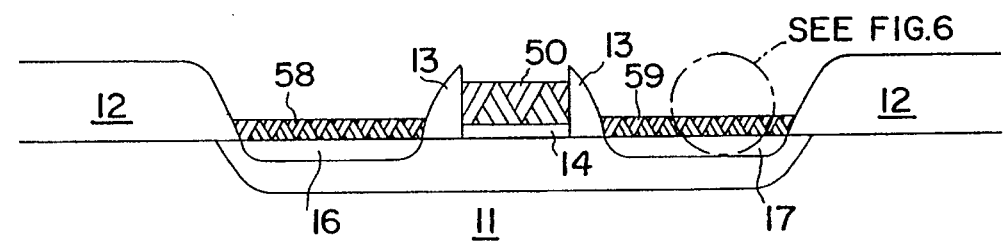
FIG. 5 is a cross-sectional schematic view of the effects of a high temperature anneal (>750° C.) on the conventional CMOS device of FIG. 4.
Figure 6:
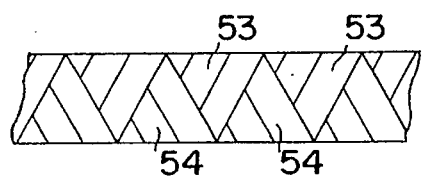
FIG. 6 is an exploded view of the conventional CMOS device of FIG. 5 showing the distinct silicide and silicon phases resulting from a high temperature anneal.

FIGS. 5 and 6 show the conventional CMOS device of FIG. 4 after an annealing at temperatures over 750° C. where the cobalt silicide/silicon source 19, drain 18 and gate 20 contacts shown in FIG. 4 degraded and which are shown in FIG. 5 as source 58, drain 59 and gate 50 contacts. In this case, the silicide layers shown in FIG. 4, including source 19, drain 18 and gate 20 contacts, agglomerated/inverted and formed a mixed silicide gate 50, source 58, and drain 59 layers having distinct phases of silicide 53 and silicon 54. FIG. 6 is an exploded view of FIG. 5 showing the mixed silicide 53 and silicon 54 phases. As known to those skilled in the art, anneals over 750° C. are required after silicide formation to electrically activate dopants in standard CMOS semiconductor devices.

In accordance with the exemplary embodiment shown in FIG. 3, the cobalt-alloy silicide gate 70, source 69 and drain 68 contacts will not break down into a mixed silicide and silicon layer when exposed to elevated temperatures as the device shown in FIG. 4 without platinum in the cobalt silicide layer.

Figure 7A:
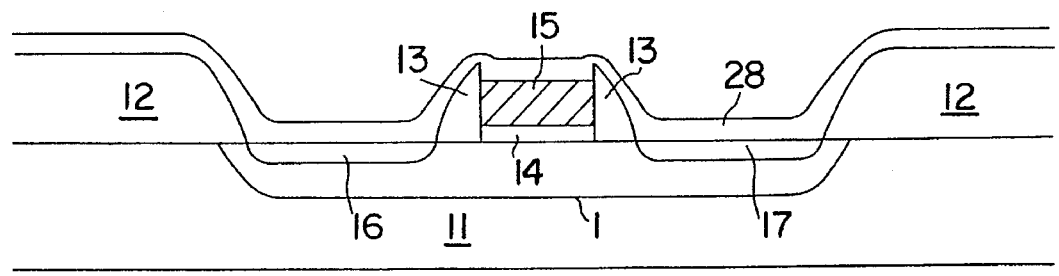
FIG. 7(a) and (b) are a cross-sectional schematic of steps of the exemplary method of the present invention which uses nitrogen instead of platinum.
Figure 7B:
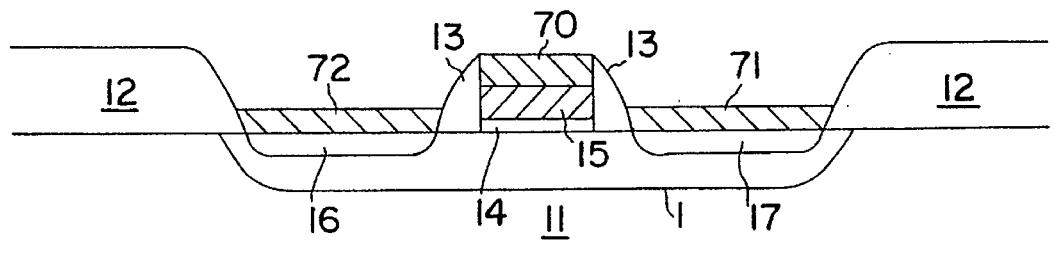

FIG. 7(b) demonstrates an alternative exemplary method of the present invention. After the formation of cobalt or cobalt silicide contact layers, nitrogen is then added to the cobalt or cobalt silicide contact layers in order to improve the stability of the formed silicide contacts under high temperature stressing. In this method, pure cobalt 28 is deposited over the entire device first as shown in FIG. 7(a). Then, the pure cobalt 28 is reacted to form cobalt silicide on the exposed silicon areas and the unreacted cobalt is stripped away. Then, nitrogen is implanted into the formed cobalt silicide, but not into the silicon substrate underneath to form the CMOS device of FIG. 7(b). This forms cobalt silicide source 72, drain 71, and gate 70 contacts having nitrogen instead of platinum disposed therein.

When this alternative exemplary embodiment is exposed to an annealing source having a temperature over 750° C., the cobalt silicide contacts do not degrade. Both elements, platinum and nitrogen, prevent the physical degradation of the silicide layers when exposed to temperatures in excess of 750° C.

The exemplary embodiments of the inventive method as shown in FIGS. 1(a)–1(e) to FIG. 3 and FIG. 7(a)–7(b), involve adding platinum and/or nitrogen to cobalt before silicide formation by annealing below 750° C. and before subsequent high temperature processing and/or adding platinum and/or nitrogen to the formed cobalt silicide before it undergoes any high temperature processing (>750° C.). As will be demonstrated in further detail, the addition of platinum or nitrogen increases the temperature at which the structure of the cobalt silicide/silicon interface degrades from 750° C. to over 1000° C.

The inventive method also relates to germanium substrates where platinum and/or nitrogen is added to cobalt before germanide formation by annealing below 750° C. and before subsequent high temperature processing and/or-where platinum and/or nitrogen is added to the formed cobalt germanide before it undergoes any high temperature processing (>750° C.).

In addition, other semiconductor or compound semiconductor materials may be used in place of silicon. These semiconductor or compound semiconductor materials may be selected from columns IIa, IIIa, IVa, Va, and VIa of the periodic table. For example, a compound semiconductor of Silicon Germanium, $Si_xGe_{x-y}$, where x and y are between 0 and 1, may also be used.

The method by which these elements are introduced into the cobalt and/or cobalt silicide is not limited to a particular method. To those skilled in the relevant art many different introduction techniques such as co-physical vapor deposition, ion implantation, electroplating and co-chemical vapor deposition may be used. For example, as shown in FIGS. 7(a)–(b), cobalt and one of platinum and nitrogen can be formed on the source, drain and gate electrodes using different deposition techniques as well as additional steps to deposit the cobalt and then platinum or nitrogen. The cobalt and the platinum or nitrogen could be deposited onto the device using co-physical vapor deposition or co-chemical vapor deposition or the cobalt layer could be first deposited upon the device and platinum or nitrogen could then be added to the cobalt layer either before or after the cobalt silicide/germanide layer is formed by annealing at temperatures below 750° C.

In addition, the cobalt layer having platinum or nitrogen could be used as an out-diffusion source by implanting dopant species into the cobalt layer having platinum or nitrogen and then subjecting the layer to a high thermal cycle to cause the dopant to out-diffuse into other layers.

Figure 8:
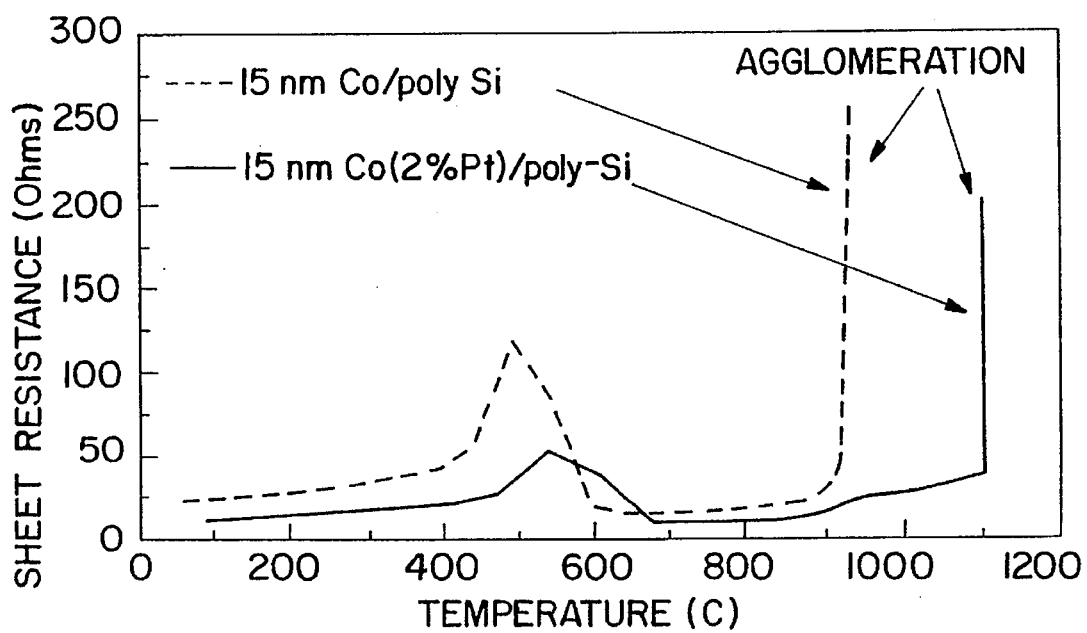
FIG. 8 is a graph showing the in situ resistance versus temperature behavior of 15 nm of pure cobalt on top of polycrystalline silicon and 15 nm of cobalt with two atomic percent platinum on top of polycrystalline silicon.

FIG. 8 compares adding platinum at a level of 2 atomic percent to the cobalt before annealing to form a cobalt silicide thin film against the formation of cobalt silicide without adding platinum. Platinum and cobalt are deposited on the silicon substrate in a manner well known to those skilled in the art. The addition of platinum enhances the thermal stability of the formed cobalt silicide during high temperature processes. In FIG. 8, the in situ resistance versus temperature from 25° to 1200° C. is plotted for a cobalt film and a cobalt-2 atomic percent platinum film on polycrystalline silicon. For both films, changes from a linear resistance versus temperature slope below 700° C. indicate cobalt silicide formation. For the pure cobalt thin film at 900° C., there is a sharp increase in the resistance of the film, indicating, as known to those skilled in the art, that the discrete structure of the cobalt silicide on top of polycrystalline silicide has degraded and intermixed.

The addition of 2 atomic percent platinum into the cobalt layer before cobalt silicide formation as shown in the exemplary methods greatly enhances the stability of the cobalt silicide-polycrystalline silicon interface. The solid line in FIG. 8 shows that the temperature at which the cobalt silicide with platinum additions starts to degrade is near 1100° C. This is higher than the 900° C. degradation temperature observed for the pure cobalt sample.

Figure 9:
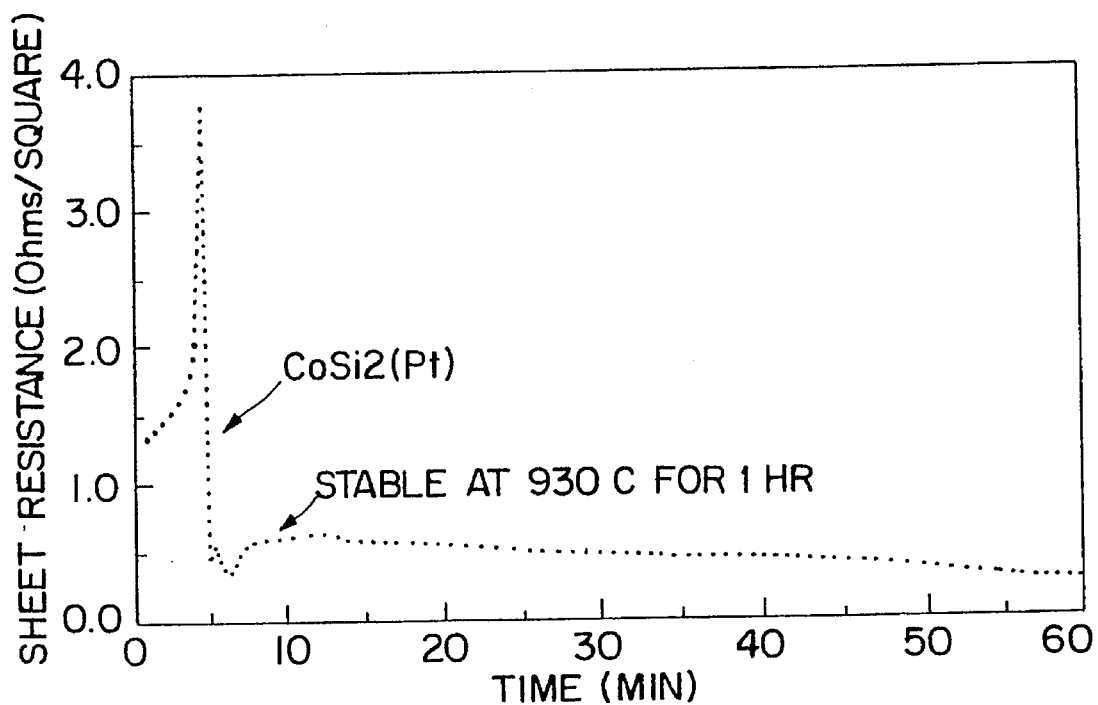
FIG. 9 is a graph showing the in situ resistance versus temperature behavior of 15 nm of cobalt with two atomic percent platinum on top of single crystal silicon.

Although the data presented in FIG. 8 has polycrystalline silicon substrate as the preferred type of silicon on which the cobalt silicide is formed, different types of substrates, for example, such as silicon, germanium or any other semiconducting layer and/or substrate in which cobalt and/or cobalt silicide/germanide is in contact with or formed thereon can be used. For example, in FIG. 9, similar results are observed when the substrate is single crystal silicon as opposed to polycrystalline silicon. FIG. 9 shows the stability of the sheet resistance of the silicide film on single crystal silicon at a temperature in excess of 900° C.

Figure 10:
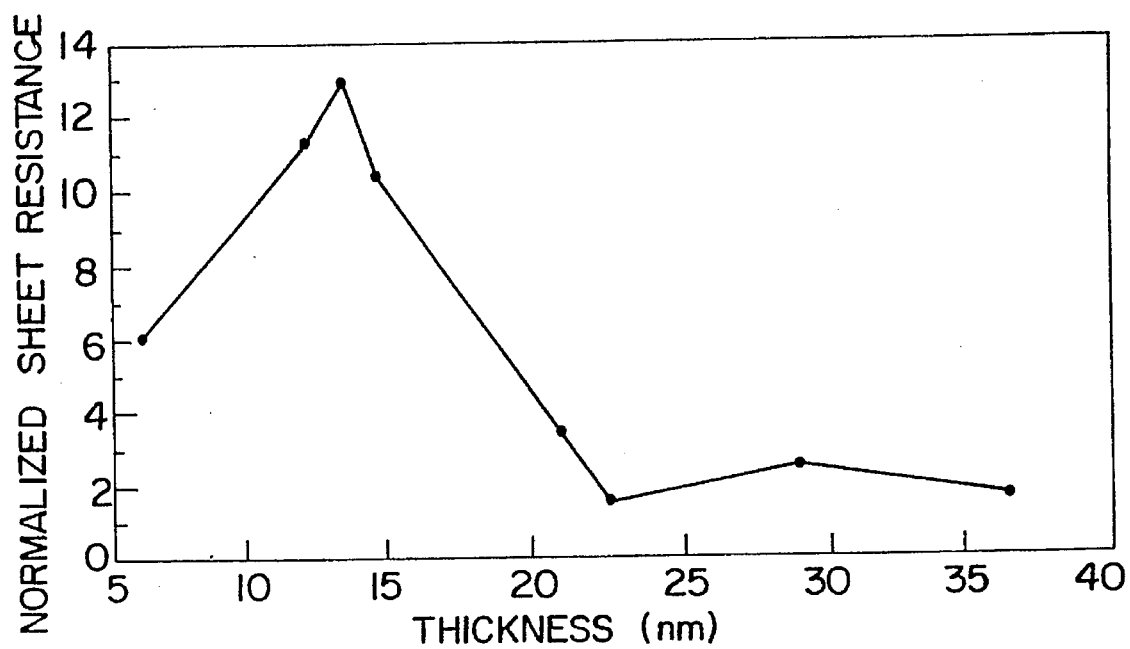
FIG. 10 is a graph showing the final sheet resistance after annealing of cobalt-platinum thin films on top of polycrystalline silicon that are 5 to 35 nm thick and contain 0.1 to 6.5 atomic percent platinum.

It should be noted that the exact composition of platinum or nitrogen in the cobalt or the cobalt silicide/germanide is not critical to obtain enhanced structural stability of the cobalt silicide/germanide. FIG. 10 is a plot of the resistance of a cobalt(platinum) silicide/polycrystalline silicon bilayer structure after being held at 930° C. for 5 minutes as a function of film thickness, where the platinum concentration in the alloy ranges from 0.15 to 6.5 percent. All these films have a low resistivity after the annealing treatment, indicating that they did not agglomerate. Cobalt silicide layer of comparable thickness formed using only cobalt was found to have structurally degraded (agglomerated) and to have an infinite resistance for this thermal cycle.

It should also be noted that the exemplary method of the present invention of adding small amounts of platinum to the cobalt and/or cobalt silicide/germanide to thermally stabilize the thin film does not depend on the initial distribution of platinum within the cobalt and/or cobalt silicide/germanide within the thin films. Various schemes have been tried for depositing platinum at various locations in the cobalt film. They all have significantly improved the thermal stability of the resultant films in a similar manner to a uniform distribution of platinum. The same results were found when nitrogen was added with various depositing schemes.

Figure 11:
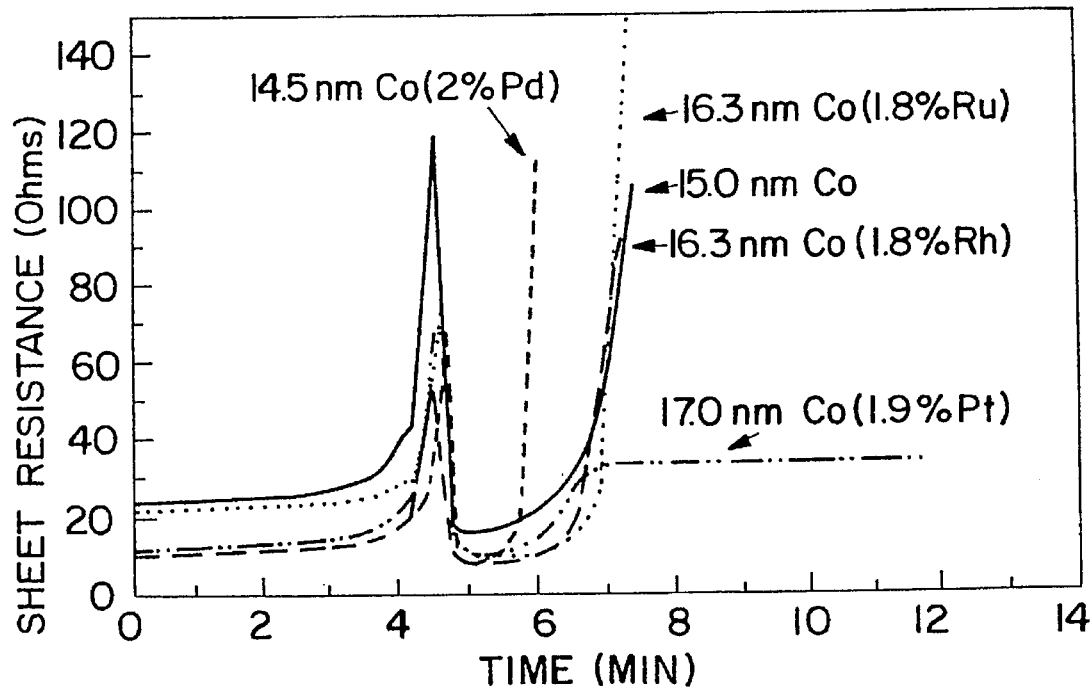
FIG. 11 is a graph showing the in situ resistance versus temperature behavior of cobalt-selected element/polycrystalline silicon thin films where the selected element is either Pd, Ru, Rh or Pt.

The use of platinum in the exemplary methods as an alloying element for cobalt and/or cobalt silicide/germanide is not arbitrary. Metal alloying elements with similar electron and chemical characteristics to platinum, will not enhance or could even possibly degrade the physical stability of cobalt silicide structures under high temperature annealing. FIG. 11 presents a plot of resistance versus time for several cobalt-alloy films on top of polycrystalline silicon as a function of time during a temperature ramp from room temperature to 930° C. The data demonstrates that platinum is the only alloy addition among similar elements (i.e. Pd, Ru, Rh) that improves the thermal stability of the formed cobalt silicide. The choice of nitrogen as an alloying element for cobalt and/or cobalt silicide/germanide is not necessarily limited. Other similar elements such as elements selected from column Va of the periodic table may be used to improve the stability of cobalt silicide/germanide films. More preferred are phosphorus and arsenic from column Va. Phosphorus and arsenic would be good substitutes for nitrogen because the elements have a similar chemical composition to nitrogen and are non-metals as nitrogen. However, nitrogen is the most preferred of the column Va elements.

Although cobalt silicide is the preferred embodiment for a stable contact layer, cobalt germanide or any intermetallic phase that could form between cobalt and a semiconducting material may be used to produce a conducting intermetallic phase that has enhanced structural stability under high temperature annealing conditions compared to a intermetallic phase that does not contain the addition of one of nitrogen and platinum.

EXAMPLE I

A 15 nm cobalt-2 atomic percent platinum film 38 is deposited onto a CMOS semiconductor device as shown in the exemplary method of FIG. 2. The cobalt-2 atomic percent platinum alloy-is reacted with the exposed silicon interfaces which comprise the source 16, gate 15 and drain 17 regions of the device by annealing the sample at 500° C. for 10 minutes to form a CoSi intermetallic phase containing platinum impurities. A standard selective chemical etch, well known to those skilled in the art, is conducted on the semiconducting device, to remove the excess unreacted cobalt. The device is then heated at 900° C. for 5 minutes to convert the cobalt silicide into the desired low resistivity phase $CoSi_2$ and to electronically activate any dopants in the source 16, gate 15 and drain 17 regions.

END OF EXAMPLE I

The mechanism believed responsible for the effectiveness of the exemplary methods of the present invention which involves the addition of platinum as the to cobalt and/or cobalt silicide is the formation of a small amount of platinum silicide precipitates, upon heating, within the dominate cobalt silicide phase. These precipitates are located within the cobalt silicide grains and at its grain boundaries. The precipitates prevent the structural degradation of the majority cobalt silicide phase during high temperature annealing. These precipitates could include, for example, precipitates of at least one of $CoY_x$, $SiY_x$ and $CoSi_zY_x$, where Y is one of nitrogen and platinum and x and z are atomic fractions.

Figure 12:
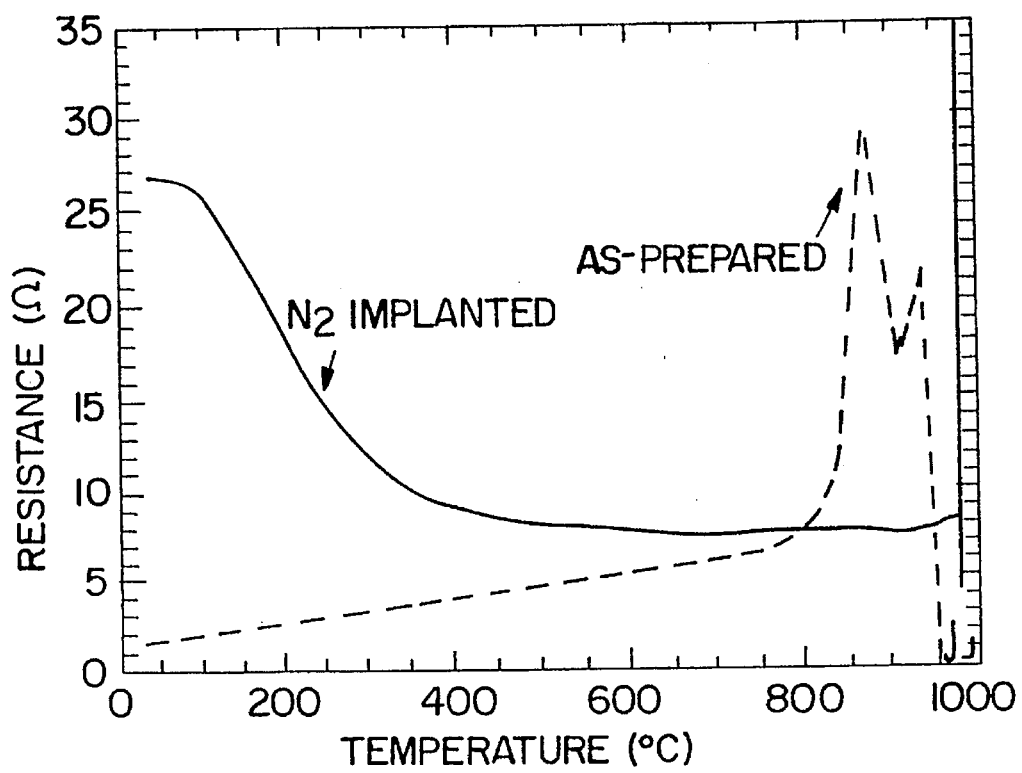
FIG. 12 is a graph of the resistance versus temperature behavior of a $CoSi_2$/polycrystalline silicon thin film with and without the addition of nitrogen by ion implantation into the $CoSi_2$ before-any high temperature processing.

FIG. 12 demonstrates that a cobalt silicide sample on top of polycrystalline-silicon without platinum or nitrogen, will show a rapid increase in sheet resistance at 750° C., indicating the onset of structural degradation of the silicide. However, a cobalt silicide sample which contains nitrogen does not degrade for annealing temperatures up to 1000° C.

It should be noted that a method-in which nitrogen could be introduced into the cobalt silicide, for example, would be by ion implantation into the silicide before any high temperature processing and at an acceleration voltage that has a corresponding ion range plus vertical straggling which is less than or equal to the silicide thickness. This is done in order to avoid any implantation damage of the underlying silicon semiconductor. It is preferred that nitrogen or platinum be implanted at an acceleration voltage so that the thickness of the silicide layer is no greater than the ion range plus vertical straggling but no less than the ion range minus vertical straggling. However, nitrogen or platinum may also be implanted at an acceleration voltage so that the thickness of the silicide layer is no greater than the ion range but no less than the ion range.

The dose rate for implanting implanting nitrogen is, for example, a dose rate from $5 \times 10^{14}$ to $5 \times 10^{17}/cm^2$.

It should also be noted that although the preferred embodiment for the introduction of nitrogen into the cobalt silicide is by ion implantation, one skilled the art could imagine a number of other introduction methods, such as physical vapor deposition or chemical vapor deposition of the cobalt and/or cobalt silicide in an environment that contains nitrogen, to introduce the nitrogen into the cobalt silicide layer.

Although nitrogen implantation into cobalt silicide is one preferred embodiment for the present invention, the present inventive method applies to the stability of any type of cobalt-intermetallic phase where the cobalt intermetallic phase is created by a reaction or a codeposition of cobalt and silicon, germanium or any other semiconductor materials.

EXAMPLE II

A cobalt film of 15 nm is deposited onto a CMOS semiconductor device. The cobalt is reacted with the exposed silicon interfaces which comprise the source, gate and drain regions of the device by annealing the sample at 500° C. for 10 minutes to form a CoSi intermetallic phase. A standard selective chemical etch, well know to those skilled in the art, is conducted on the semiconducting device, to remove the excess unreacted cobalt. Nitrogen ions are then implanted into the CoSi at a dose of $1 \times 10^{16}/cm^2$ and at a energy of 80 keV. The device is then heated at 900° C. for 5 minutes to convert the cobalt silicide into the desired low resistivity phase, $CoSi_2$, and also to electronically activate any dopants in the source, gate and drain regions.

END OF EXAMPLE II

The presence of nitrogen in the cobalt silicide does not cause stabilizing cobalt nitride precipitates to form, as would form in the case of $TiSi_2$ implanted with nitrogen. This is because the positive heat of formation of cobalt nitride (thermodynamically unfavorable formation) as opposed to the negative heat of formation (thermodynamically favorable formation) for titanium nitride.

It is emphasized that, according to common practice in semiconductor representation, the various layers of the drawing are not to scale. On the contrary, the width or length and thickness of the various layers are arbitrarily expanded or reduced for clarity.

While the overall invention has been described in terms of the preferred embodiments and examples, those skilled in the art will recognize that the specific configurations, steps and parameters may be varied in the practice of the invention by those skilled in the art without departing from the spirit of the invention, the scope of which is defined by the appended claims.

What is claimed is:

1. A semiconductor device, comprising:

a substrate;

a layer of a mixture of cobalt and silicon disposed on said substrate; and an element disposed in said layer of cobalt and silicon, wherein said element is selected from the group consisting of nitrogen and platinum.

2. The semiconductor device of claim 1, wherein said substrate is selected from the group consisting of amorphous silicon, single crystal silicon, polycrystalline silicon, amorphous germanium, single crystalline germanium, polycrystalline germanium, amorphous $Si_xGe_{x-y}$, where x and y are between 0 and 1, single crystal $Si_xGe_{x-y}$, and polycrystalline $Si_xGe_{x-y}$.

3. The semiconductor device of claim 1, wherein the selected element is platinum and the concentration of platinum in said layer has an atomic concentration of less than 10%.

4. The semiconductor device of claim 1, wherein said layer has a thickness of less than 200 nm.

5. A semiconductor device, comprising:

a substrate; and a film comprising:

(a) a layer of a mixture of cobalt and silicon disposed on said substrate; and (b) an element disposed in said layer, said element is selected from the group consisting of platinum and column Va elements of the periodic table;

wherein said film is thermally stable and resistant to agglomeration and layer inversion during elevated thermal cycles.

6. The semiconductor device of claim 5, wherein said film is thermally stable and resistant to agglomeration and layer inversion during thermal cycles greater than 750 degrees centigrade.

7. The semiconductor device of claim 5, wherein said substrate is one of an elemental semiconductor and a compound semiconductor where the semiconductor components are selected from the group consisting of elements from columns IIb, IIIa, IVa, Va, and VIa of the periodic table.

8. The semiconductor device of claim 5, wherein the selected element is platinum and the concentration of the platinum in the film has an atomic concentration in a range from 0.15% to 6.5%.

9. The semiconductor device of claim 5, wherein the selected element is platinum and the concentration of the platinum in the film has an atomic concentration of less than 10%.

10. The semiconductor device of claim 5, wherein said film is patterned.

11. The semiconductor device of claim 5, wherein said element is selected from the group consisting of platinum, nitrogen, phosphorus and arsenic.

12. The semiconductor device of claim 5, wherein said element is selected from the group consisting of platinum and nitrogen.

13. The semiconductor device of claim 5, wherein said layer has a thickness of less than 200 nm.

* * * * *